US012365475B2

(12) United States Patent
Pons et al.

(10) Patent No.: US 12,365,475 B2
(45) Date of Patent: Jul. 22, 2025

(54) PROPULSION ASSEMBLY COMPRISING AT LEAST ONE REGULATED VENTILATION DEVICE, AIRCRAFT COMPRISING SUCH A PROPULSION ASSEMBLY

(71) Applicant: Airbus Operations (S.A.S.), Toulouse (FR)

(72) Inventors: François Pons, Toulouse (FR); Christian Flemin, Toulouse (FR)

(73) Assignee: Airbus Operations (S.A.S.), Toulouse (FR)

( * ) Notice: Subject to any disclaimer, the term of this patent is extended or adjusted under 35 U.S.C. 154(b) by 0 days.

(21) Appl. No.: 18/616,576

(22) Filed: Mar. 26, 2024

(65) Prior Publication Data

US 2024/0327019 A1 Oct. 3, 2024

(30) Foreign Application Priority Data

Mar. 31, 2023 (FR) ...................................... 2303137

(51) Int. Cl.
*B64D 33/08* (2006.01)
*H10N 10/80* (2023.01)

(52) U.S. Cl.
CPC ............. *B64D 33/08* (2013.01); *H10N 10/80* (2023.02)

(58) Field of Classification Search
CPC ...... F02C 7/18; F02C 9/18; F02C 7/12; F02C 7/14; F02C 7/141; F02C 7/185; B64D 2033/024
See application file for complete search history.

(56) References Cited

U.S. PATENT DOCUMENTS

| | | | | |
|---|---|---|---|---|
| 10,066,551 B2 * | 9/2018 | Verseux | ..................... | F02C 7/32 |
| 11,619,176 B2 * | 4/2023 | Cerutti | ...................... | F02C 9/18 60/779 |
| 11,773,742 B2 * | 10/2023 | Ortiz | ........................ | F01D 5/02 60/806 |
| 11,791,691 B2 * | 10/2023 | Seki | ........................ | H02K 9/02 290/52 |

(Continued)

FOREIGN PATENT DOCUMENTS

| | | | | |
|---|---|---|---|---|
| CN | 118647249 A | * | 9/2024 | |
| CN | 118723094 A | * | 10/2024 | ............. B64D 33/08 |

(Continued)

OTHER PUBLICATIONS

French Search Report for Application No. 2303137 dated Oct. 10, 2023.

*Primary Examiner* — Craig Kim
(74) *Attorney, Agent, or Firm* — KDW Firm PLLC

(57) ABSTRACT

An aircraft propulsion assembly with at least one ventilation device to cool at least one zone of the propulsion assembly. The ventilation device is regulated and includes at least one ventilation hole emerging in the zone to be cooled, at least one valve movable between a closed position where the valve shuts the ventilation hole and an open position where the valve at least partially frees the ventilation hole, at least one thermoelectric generator to generate an electric current and at least one automatic control to control the position of the valve by using the electrical current generated by the thermoelectric generator. The bleed air flow rate can be adjusted as a function of the cooling needs. An aircraft including at least one such propulsion assembly is disclosed.

19 Claims, 3 Drawing Sheets

(56) References Cited

U.S. PATENT DOCUMENTS

| | | | | |
|---|---|---|---|---|
| 11,846,233 | B2 * | 12/2023 | Sommerer | B64D 33/08 |
| 11,951,341 | B2 * | 4/2024 | Sommerer | F02C 7/18 |
| 12,031,484 | B2 * | 7/2024 | Millhaem | F02C 7/18 |
| 12,116,930 | B2 * | 10/2024 | Maurer | F02C 7/042 |
| 2013/0186102 | A1 * | 7/2013 | Lo | F02K 3/075 60/785 |
| 2015/0082804 | A1 * | 3/2015 | Charrier | H10N 10/13 60/785 |
| 2015/0267616 | A1 * | 9/2015 | Verseux | F02C 7/18 60/772 |
| 2016/0123185 | A1 * | 5/2016 | Le Pache | F01D 25/12 417/53 |
| 2016/0319697 | A1 * | 11/2016 | Akin | F02K 1/822 |
| 2017/0058777 | A1 * | 3/2017 | Army | F16K 31/04 |
| 2017/0248076 | A1 * | 8/2017 | Dierksmeier | B64D 27/10 |
| 2018/0016933 | A1 * | 1/2018 | Elbibary | F01D 21/00 |
| 2019/0120082 | A1 * | 4/2019 | Zebian | F01D 25/14 |
| 2024/0327019 | A1 * | 10/2024 | Pons | F02C 7/18 |

FOREIGN PATENT DOCUMENTS

| | | | | |
|---|---|---|---|---|
| EP | 3483414 A1 * | 5/2019 | | F01D 17/105 |
| EP | 4279815 A1 * | 11/2023 | | F24C 3/103 |
| EP | 4435264 A1 * | 9/2024 | | B64D 13/02 |
| WO | WO-2015156872 A2 * | 10/2015 | | B64D 41/00 |

\* cited by examiner

PROPULSION ASSEMBLY COMPRISING AT LEAST ONE REGULATED VENTILATION DEVICE, AIRCRAFT COMPRISING SUCH A PROPULSION ASSEMBLY

TECHNICAL FIELD

The disclosure herein relates to a propulsion assembly comprising at least one ventilation device configured to cool at least one zone of the propulsion assembly and an aircraft comprising at least one such propulsion assembly.

BACKGROUND

According to an embodiment visible in FIG. 1, an aircraft 10 comprises a fuselage 12, wings 14 positioned on either side of the fuselage and propulsion assemblies 16 positioned under the wings and linked to the latter by pylons 18. Each propulsion assembly 16 comprises an engine 20 and a nacelle 22 surrounding the engine 20 and notably making it possible to channel an air stream towards the engine 20.

The engine 20 has an axis of rotation A20. For the description below, a longitudinal direction is a direction parallel to the axis of rotation A20. A longitudinal plane is a plane containing the axis of rotation A20. A transverse plane is a plane at right angles to the axis of rotation A20. The front/upstream and rear/downstream concepts refer to the direction of flow of the air stream in the engine 20 in operation, which flows from the front/upstream to the rear/downstream.

According to an embodiment visible in FIG. 2, the propulsion assembly is a turbofan engine. The engine 20 comprises, from the front to the rear, a fan 20.1, an engine core 20.2, an outer wall 20.3 surrounding the engine core 20.2 and a first nozzle 20.4 in the extension of the engine core 20.2. The outer wall 20.3 is also called Inner Fixed Structure or IFS.

The nacelle 22 generally has a tubular structure comprising an air inlet 22.1 upstream of the engine 20, an intermediate part 22.2 intended to surround the fan 20.1, a rear part 22.3 that can incorporate thrust reversers, positioned around the outer wall 20.3 and generally terminated by a second nozzle 22.4. The nacelle 22 also has an inner wall 22.5 spaced apart from the engine 20, notably from its outer wall 20.3.

In operation, a primary stream circulates in the engine core 20.2 and leaves via the first nozzle 20.4. A secondary stream leaving the fan 20.1 circulates in an annular duct 24 delimited by the outer wall 20.3 of the engine 20 and the inner wall 22.5 of the nacelle 22. The primary and secondary streams are ejected via the first and second nozzles 20.4, 22.4. According to one configuration, the outer wall 20.3 of the engine 20 comprises a thermal barrier and separates a hot zone Zc, inside the engine 20, and a cold zone Zf outside of the engine 20, in the annular duct 24.

As illustrated in FIG. 2, the propulsion assembly 16 comprises at least one ventilation device 26 configured to cool certain zones of the propulsion assembly 16, in particular the engine core 20.2 as well as the zone contained between the outer wall 20.3 and the engine core 20.2 (this zone being called Core Zone) where the equipment and systems of the engine 20 are installed. This ventilation device 26 generates cold air streams 28 in the engine 20 and the nacelle 22.

This ventilation device 26 comprises, among other things, at least one ventilation hole 26.1, passing through the outer wall 20.3 of the engine 20, which has a fixed flow area. The ventilation device 26 is designed for the greatest requirements, notably during the takeoff phase of the aircraft with a high temperature on the ground and a high thrust of the engine 20 causing a significant heating thereof.

Consequently, for certain flight phases, like the cruising phase for example, the flow area of the ventilation hole 26.1 is overdimensioned for the cooling requirements. This overdimensioning causes too much air to be captured in the secondary stream and the thrust of the propulsion assembly 16 to be reduced, which is reflected by an increase of energy consumption in identical thrust and flight conditions.

SUMMARY

The disclosure herein aims to remedy all or part of the drawbacks of the prior art.

To this end, the subject of the disclosure herein is an aircraft propulsion assembly comprising an engine, a nacelle positioned around the engine, an annular duct positioned between the engine and the nacelle and configured to channel a cold air stream and at least one ventilation device configured to cool at least one zone to be cooled of the propulsion assembly, the ventilation device comprising at least one ventilation hole which emerges in the zone to be cooled.

According to the disclosure herein, the ventilation device is regulated and comprises:
- at least one valve that is movable between a closed position in which the valve shuts the ventilation hole and an open position in which the valve at least partially frees the ventilation hole,
- at least one thermoelectric generator configured to generate an electric current by harvesting a part of the heat produced by the engine,
- at least one automatic control configured to control the position of the valve by using the electric current generated by the thermoelectric generator.

This solution makes it possible to obtain a regulated ventilation device, the flow area of the ventilation hole equipped with the valve and the bleed air flow rate being able to be adjusted as a function of the cooling requirements. The use of a thermoelectric generator makes it possible to use a resource that is available in the propulsion assembly to displace the valve and/or regulate its position.

According to another feature, the ventilation device comprises at least one electric actuator configured to displace the valve in at least one first direction out of a direction going from the open position to the closed position and a direction going from the closed position to the open position.

According to another feature, the ventilation device comprises at least one spring configured to push and keep the valve in the open position, the electric actuator being configured to displace the valve from the open position to the closed position against the efforts exerted by the spring.

According to one embodiment, the ventilation device comprises at least one electric cable linking the thermoelectric generator and the electric actuator such that the electric current generated by the thermoelectric generator powers the electric actuator.

According to another feature, the ventilation device comprises at least one converter comprising a function configured to transform the electric current generated by the thermoelectric generator into a power supply current to power the electric actuator, a given value of the power supply current being a function of a given value of the current generated by the thermoelectric generator and corresponding to a given position of the valve.

According to another embodiment, the ventilation device comprises at least one relay configured to receive a power current and transmit it to the electric actuator as power supply current as a function of a control current generated by the thermoelectric generator.

According to another feature, the relay is configured to occupy an activated state, when the control current has a value lower than a threshold value, in which the relay allows the passage of the power current, the power supply current having a value equal to that of the power current, and a deactivated state, when the control current has a value greater than or equal to the threshold value, in which the relay blocks the power current, the power supply current having a zero value.

According to another feature, the ventilation device comprises at least one switch, positioned between a power supply and the relay, configured to occupy an on state in which the switch transmits the power current to the relay and an off state in which the switch blocks the power current.

According to another feature, the thermoelectric generator is positioned downstream of the ventilation hole such that an air stream passing through the ventilation hole impacts the thermoelectric generator.

According to another feature, the thermoelectric generator comprises a first face in contact with a cold source or with a cold ambience cooled by a cold source and a second face in contact with a hot source or a hot ambience heated by a hot source which exhibits a temperature gradient with the cold source or the cold ambience, the thermoelectric generator being positioned such that its second face is in contact with a hot source to be cooled or with a hot ambience to be cooled.

According to one configuration, the engine comprises an engine core delimited by a shroud, an outer wall surrounding the engine core, away from the shroud and delimiting the annular duct, and an intermediate zone positioned between the shroud of the engine core and the outer wall, the outer wall having an inner face oriented towards the engine core and an outer face opposite the inner face, the zone to be cooled corresponding to the intermediate zone and the ventilation hole passing through the outer wall.

According to one construction, the thermoelectric generator is positioned at the outer wall and has a first face situated at the outer face of the outer wall and in contact with the cold air stream and a second face in contact with hot air present in the intermediate zone.

According to another construction, the thermoelectric generator is positioned at the shroud of the engine core and has a first face in contact with air present in the intermediate zone and a second face pressed against the shroud of the engine core.

Also, a subject of the disclosure herein is an aircraft comprising at least one propulsion assembly according to one of the preceding features.

BRIEF DESCRIPTION OF THE DRAWINGS

Other features and advantages will emerge from the description of the disclosure herein which follows, the description being given purely by way of example, in light of the attached drawings in which.

DETAILED DESCRIPTION

Figure 1:
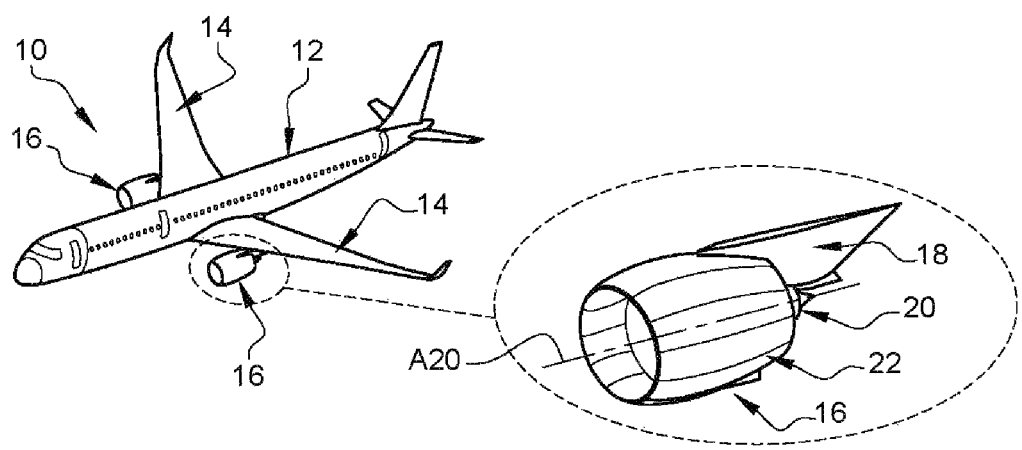
FIG. 1 is a perspective view of an aircraft and, in detail, of a propulsion assembly.
Figure 2:
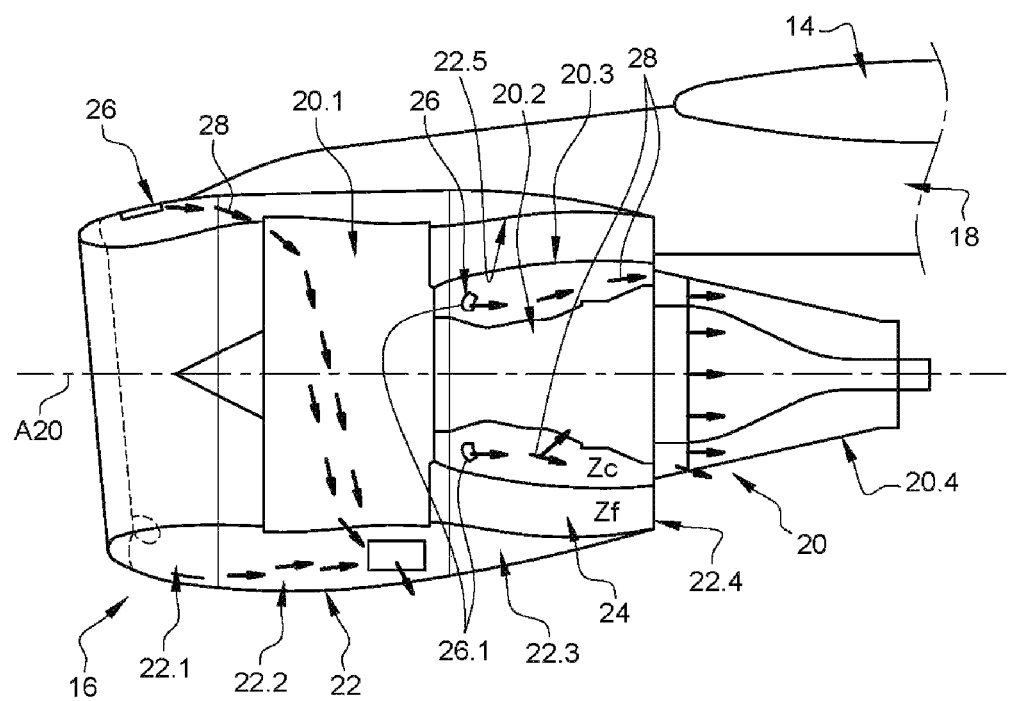
FIG. 2 is a longitudinal cross-section of a propulsion assembly illustrating an embodiment of the prior art.
Figure 3:
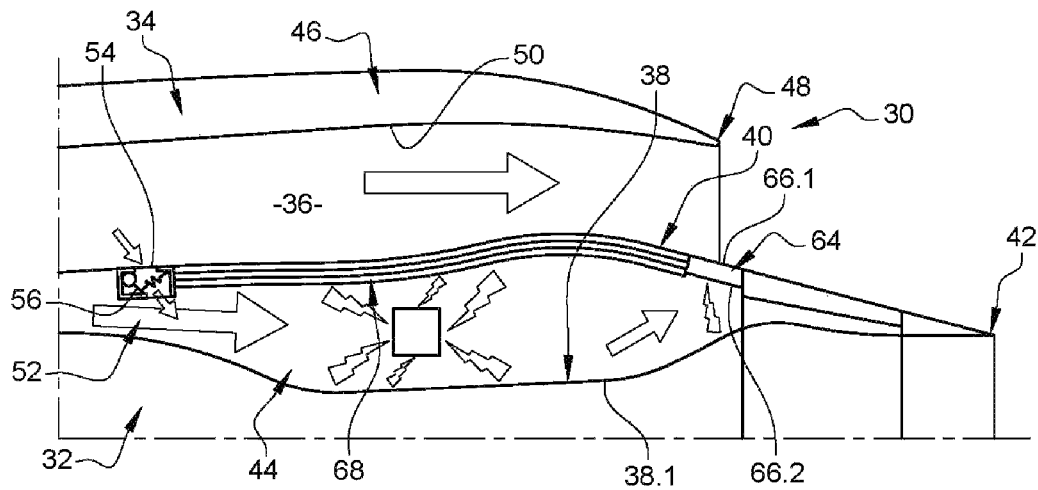
FIG. 3 is a longitudinal cross-section of a part of a propulsion assembly comprising a ventilation device illustrating an embodiment of the disclosure herein.
Figure 6:
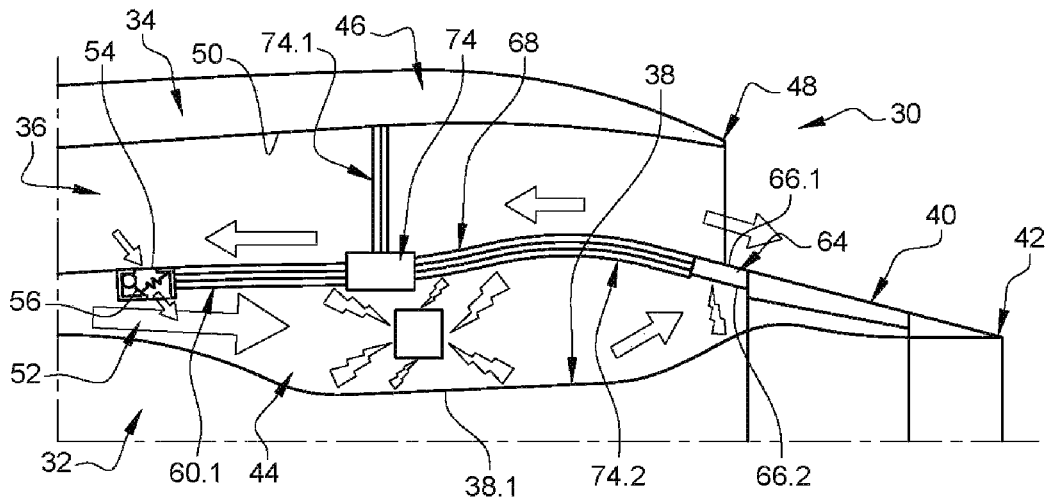
FIG. 6 is a longitudinal cross-section of a part of a propulsion assembly comprising a ventilation device illustrating another embodiment of the disclosure herein.

According to an embodiment visible in FIGS. 3 and 6, a propulsion assembly 30 of an aircraft comprises an engine 32, a nacelle 34 positioned around the engine 32 and an annular duct 36 configured to channel a cold air stream, called secondary stream, between the engine 32 and the nacelle 34.

The engine 32 comprises, from the front to the rear, a fan (not represented), an engine core 38 (this zone being called Core Zone) delimited by a shroud 38.1, an outer wall 40 surrounding the engine core 38, away from its shroud 38.1, and a first nozzle 42 in extension of the engine core 38. The outer wall 40 is also called Inner Fixed Structure or IFS. According to one configuration, the outer wall 40 comprises at least one part spaced apart from the engine core 38 which has an inner face Fint oriented towards the engine core 38 and an outer face Fext opposite the inner face Fint. According to one embodiment, the outer wall 40 comprises a sandwich panel which has at least one cellular structure inserted between an outer skin forming the outer face Fext and an inner skin forming the inner face Fint. According to one design, the outer wall 40 comprises a thermal insulation on the inner face Fint.

The engine 32 comprises an intermediate zone 44 positioned between the shroud 38.1 of the engine core 38 and the outer wall 40.

The nacelle 34 generally has a tubular structure comprising an air inlet upstream of the engine 32, an intermediate part intended to surround the fan, a rear part 46 that can incorporate thrust reversers, positioned around the outer wall 40 and generally terminated by a second nozzle 48. The nacelle 34 also has an inner wall 50 spaced apart from the engine 32, notably from its outer wall 40.

In operation, a primary stream circulates in the engine core 38 and leaves via the first nozzle 42. A secondary stream leaving the fan circulates in the annular duct 36 delimited by the outer wall 40 of the engine 32 and the inner wall 50 of the nacelle 34. The primary and secondary streams are ejected via the first and second nozzles 42, 48. The outer wall 40 of the engine 32 separates a hot zone Zc inside the engine 32, in the intermediate zone 44, and a cold zone Zf outside of the engine 32, in the annular duct 36.

The propulsion assembly 30, the engine 32 and the nacelle 34 are not described further because they can be identical to those of the prior art.

The propulsion assembly 30 comprises at least one ventilation device 52, configured to cool at least one zone to be cooled of the propulsion assembly 30 and comprising at least one ventilation hole 54 which has a flow area, passing through a first wall in contact with the cold air stream and emerging in the zone to be cooled, the first wall separating the hot and cold zones Zc, Zf. According to one configuration, the zone to be cooled corresponds to the intermediate zone 44 and the first wall corresponds to the outer wall 40.

According to embodiments visible in FIGS. 4, 5, 7 and 8, the ventilation device 52 is said to be regulated because it allows the ventilation to be regulated. To this end, it comprises a valve 56 and an articulation 58, linking the valve 56 and the first wall, configured to allow the valve 56 to occupy a closed position in which the valve 56 shuts the ventilation hole 54 and an open position in which the valve 56 at least partially frees the ventilation hole 54. According to one configuration, the valve 56 is configured to occupy a first extreme position corresponding to the closed position in which the flow area of the ventilation hole 54 has a zero value and a second extreme position corresponding to a totally open position in which the flow area of the ventilation hole 54 has a maximum value and intermediate positions for each of which the flow area of the ventilation hole 54 has a value lying between the zero value and the maximum value. According to one embodiment, the articulation 58 comprises a pivoting link. In the open position, the valve 56 is situated in the hot zone Zc.

The ventilation device 52 comprises at least one electric actuator 60 configured to displace the valve 56. The electric actuator 60 is powered by a power supply current 60.1 having a given value. According to one construction, the electric actuator 60 comprises a first end linked to the first wall and a second end linked to the valve 56.

According to one configuration, the electric actuator 60 is configured to position the valve 56 in a given position between the closed position and the totally open position as a function of the value of the power supply current 60.1.

According to one embodiment, the ventilation device 52 comprises at least one spring 62 configured to displace the valve 56 into the open position and keep it in this position. In addition, the electric actuator 60 is configured to displace the valve 56 from the open position to the closed position against the efforts exerted by the spring 62. For the present application, the term spring 62 covers any return means.

More generally, the electric actuator 60 is configured to displace the valve 56 in at least one first direction out of a direction going from the open position to the closed position and a direction going from the closed position to the open position and at least one spring 62 configured to displace the valve in a second direction opposite to the first direction. The solution in which the spring 62 pushes the valve 56 into the open position is prioritized because the ventilation hole 54 is automatically in the totally open position in the event of a malfunction notably of the electric actuator 60.

According to the first and second embodiments visible in FIGS. 3 to 8, the ventilation device 52 comprises at least one thermoelectric generator 64, called TEG (Thermo Electrical Generator) comprising a first face 66.1 in contact with a cold source or with a cold ambience cooled by a cold source and a second face 66.2 in contact with a hot source or a hot ambience heated by a hot source which exhibits a temperature gradient with the cold source or the cold ambience, the thermoelectric generator 64 producing an electrical current with a given value as a function of the temperature gradient between the cold and hot sources. The transfer of heat between the cold source and the first face 66.1 can be obtained by conduction when the cold source is in direct contact with the first face 66.1 or by convection when the cold source is away from the first face 66.1. The transfer of heat between the hot source and the second face 66.2 can be obtained by conduction when the hot source is in direct contact with the second face 66.2 or by convection when the hot source is away from the second face 66.2.

According to one configuration, the thermoelectric generator 64 comprises at least one plate comprising semiconductors and uses the Seebeck effect to produce electricity as a function of the temperature gradient between the first and second faces 66.1, 66.2.

Figure 4:
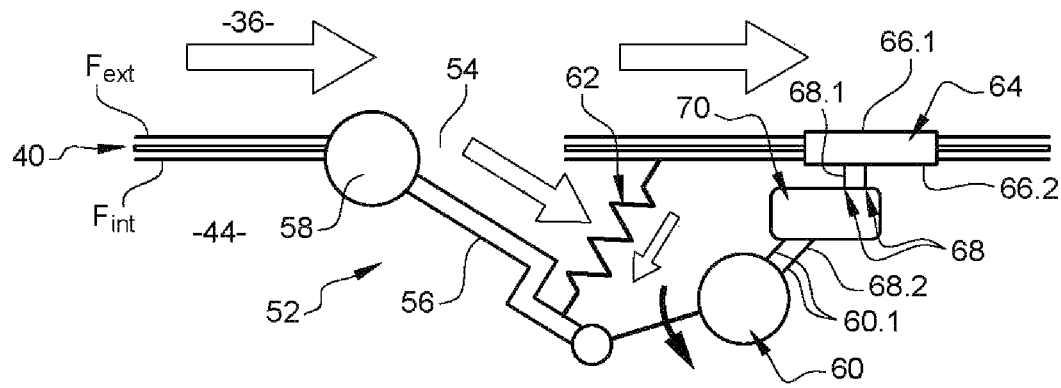
FIG. 4 is a schematic representation of a ventilation device comprising a valve in open position illustrating an embodiment of the disclosure herein.
Figure 5:
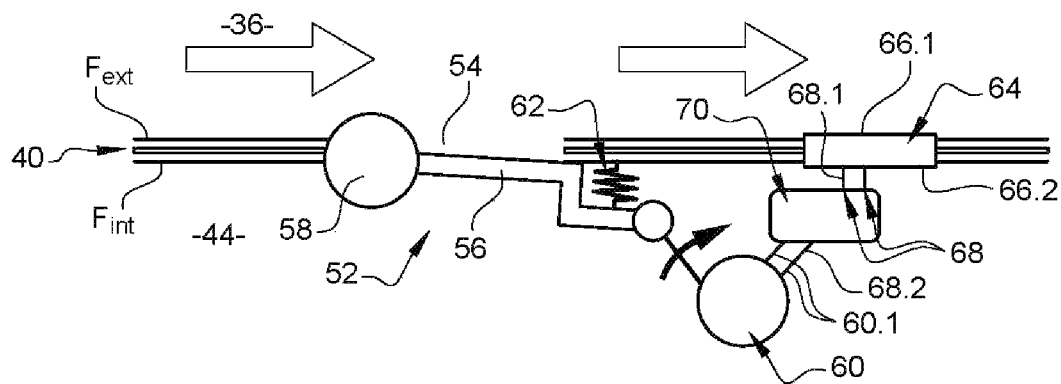
FIG. 5 is a schematic representation of the ventilation device visible in FIG. 4, the valve being in the closed position.

According to the first embodiment visible in FIGS. 3 to 5, the electrical current generated by the thermoelectric generator 64 is used to power the electric actuator 60. To this end, the ventilation device 52 comprises at least one electric cable 68 linking the thermoelectric generator 64 and the electric actuator 60. According to one configuration, the ventilation device 52 comprises at least one converter 70, the electric cable 68 comprising a first section 68.1 linking the thermoelectric generator 64 and the converter 70 and a second section 68.2 linking the converter 70 and the electric actuator 60. For the present application, an electric cable is understood to be a single electric cable or several electric cables grouped together in a cable loom.

The converter 70 comprises a function configured to transform the electrical current, with a low value, generated by the thermoelectric generator 64, into a power supply current 60.1 for the electric actuator, a given value of the power supply current 60.1 being a function of a given value of the electrical current generated by the thermoelectric generator 64 and corresponding to a given position of the valve 56. This function makes it possible to have a fixed position of the electric actuator 60 (therefore an angle of opening of the valve 56) correspond with a value of the current produced by the thermoelectric generator 64. This solution makes it possible to obtain a fine regulation of the ventilation.

According to this first embodiment, the ventilation device 52 is autonomous, the position of the valve 56 being adjusted as a function of the temperature gradient between the cold and hot sources Zf, Zc. The greater the temperature gradient, which corresponds to a significant cooling requirement, the closer the position occupied by the valve 56 to the open position. On the other hand, the lower the temperature gradient, which corresponds to a low cooling requirement, the closer the position occupied by the valve 56 to the closed position.

According to one configuration, the converter function 70 is configured so as to limit the fixed positions occupied by the electric actuator 60. Thus, a given fixed position of the electric actuator 60 corresponds to at least a range of temperature gradients and not to one temperature gradient.

Figure 7:
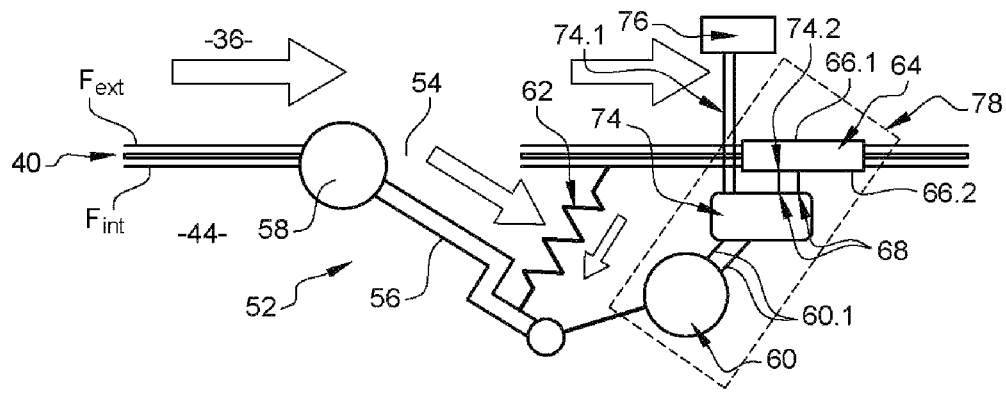
FIG. 7 is a schematic representation of a ventilation device comprising a valve in the open position illustrating another embodiment of the disclosure herein.
Figure 8:
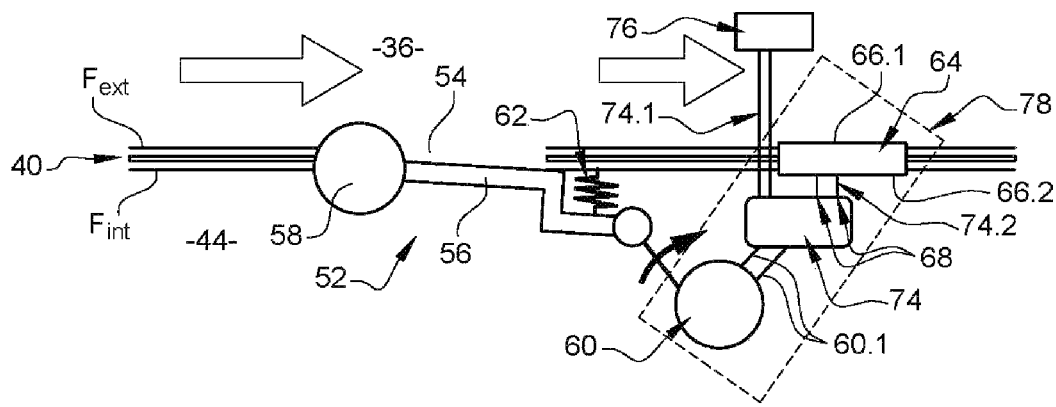
FIG. 8 is a schematic representation of the ventilation device visible in FIG. 7, the valve being in the closed position.

According to a second embodiment visible in FIGS. 6 to 8, the ventilation device 52 comprises at least one relay 74 configured to receive a power current 74.1 with a high value, coming from an electric power supply of the aircraft, and transmit it to the electric actuator 60 as power supply current 60.1 as a function of a control current 74.2.

The control current 74.2 is generated by the thermoelectric generator 64.

According to this second embodiment, the aircraft comprises a power supply 76 generating the power current 74.1 intended for the ventilation device 52, more particularly for the relay 74. According to one construction, the ventilation device 52 comprises at least one switch, positioned between the power supply 76 and the relay 74, configured to occupy an on state in which the switch transmits the power current 74.1 to the relay 74 and an off state in which the switch blocks the power current 74.1. Thus, the ventilation device 52 can be simply deactivated. This switch is positioned in the aircraft so as to be able to be actuated by an operator. This solution is more particularly suited to manual operations on the ground. Thus, the functionality of the ventilation device 52 can be disabled or tested on the ground.

According to one configuration, the relay 74 is configured to occupy an activated state, when the control current 74.2 has a value lower than a threshold value, in which the relay 74 allows the passage of the power current 74.1, the power supply current 60.1 of the electric actuator 60 having a value equal to that of the power current 74.1 (to place the valve 56 in closed position in cold condition cases), and a deactivated state, when the control current 74.2 has a value greater than or equal to the threshold value, in which the relay 74 blocks the power current 74.1, the power supply current 60.1 of the electric actuator 60 having a zero value (to place the valve 56 in totally open position in cases of hot conditions or of a malfunction). Since the value of the control current 74.2 is proportional to the temperature gradient between the hot and cold sources Zc, Zf, the threshold value of the control current 74.2 corresponds to a determined value of the temperature gradient between the hot and cold sources, Zc, Zf.

According to this configuration, as long as the temperature gradient is greater than or equal to the determined value (that is to say in hot conditions), which corresponds to a situation for which cooling is necessary, the control current 74.2 has a value less than or equal to the threshold value. Consequently, the relay 74 is in the deactivated state, the power supply current 60.1 has a zero value and the spring 62 keeps the valve 56 in the totally open position.

As soon as the temperature gradient is less than or equal to the determined value (that is to say in cold conditions), which corresponds to a situation for which cooling is not necessary, the control current 74.2 has a value greater than the threshold value. Consequently, the relay is in the activated state, the power supply current 60.1 has a value equal to that of the power current and the valve 56 occupies a given position as a function of the value of the power current.

This configuration simplifies the automatic control of the position of the valve 56.

According to one mode of operation, the power current 74.1 is modulated upstream of the relay as a function of the position desired for the valve 56.

According to another mode of operation, the power current 74.1 has a fixed value and the relay 74 comprises a function configured to modify the value of the power current 74.1 into a value for the power supply current 60.1 which is a function of the value of the control current 74.2 generated by the thermoelectric generator 64. In a variant, the electrical current produced by the thermoelectric generator 64 is converted by a converter which comprises a function of conversion (as for the first embodiment) into a control current 74.2 driving the relay 74.

Of course, the disclosure herein is not limited to these embodiments for the automatic control of the valve 56.

Whatever the embodiment, the ventilation device 52 is regulated. To this end, it comprises at least one thermoelectric generator 64 and at least one automatic control 78 configured to control the position of the valve 56 by using the electric current generated by the thermoelectric generator 64.

With an electric actuator 60 present, the automatic control 78 controls the power supply current 60.1 supplied to the electric actuator 60 and therefore the position of the valve 56 on the basis of a power current coming from at least one thermoelectric generator 64 of the ventilation device 52 and/or from a source of the aircraft that is independent of the ventilation device 52. This automatic control 78 is configured to modulate the value of the power supply current 60.1 on the basis of at least one characteristic of a control current, which can be the value of the current supplied by at least one thermoelectric generator 64 of the ventilation device 52.

According to a first configuration visible in FIGS. 3 and 6, the thermoelectric generator 64 is positioned at the outer wall 40, its first face 66.1 being situated at the outer face Fext of the outer wall 40 and in contact with the cold secondary stream, its second face 66.2 being in contact with the hot air present in the intermediate zone 44. According to this positioning, the maximum temperature gradient is of the order of around a hundred degrees in operation. According to this configuration, the electric cable 68 is incorporated in the outer wall 40. According to this first configuration, the thermoelectric generator 64 is positioned close to a transverse plane passing through the trailing edge of the second nozzle 48.

According to another configuration, the thermoelectric generator 64 is positioned at the shroud 38.1 of the engine core 38 which is very hot, its second face 66.2 being pressed against the shroud 38.1, the first face 66.1 being in contact with the less hot air present in the intermediate zone 44. According to this positioning, the maximum temperature gradient can exceed 300° C. Thus, in this second configuration, the current supplied by the thermoelectric generator 64 can have a value clearly greater than that of the current supplied by a thermoelectric generator 64 positioned according to the first configuration. However, incorporating the electric cable 68 in the intermediate zone 44 proves to be very complicated.

According to a construction visible in FIGS. 3 and 6, the thermoelectric generator 64 is positioned downstream of the ventilation hole 54 in a hot zone such that an air stream passing through the ventilation hole 54 and being heated up by circulating in the hot zone towards the rear of the engine 32 impacts the thermoelectric generator 64, more particularly its second face 66.2.

According to one configuration, the thermoelectric generator 64 is positioned such that its second face 66.2 is in direct contact with a hot source to be cooled or with a hot ambience to be cooled. This configuration makes it possible to obtain a ventilation device which self-regulates as a function of the cooling requirements.

Obviously, the disclosure herein is not limited to the embodiments visible in FIGS. 3 to 8. Thus, the ventilation device 52 can comprise one or more ventilation holes 54 and one or more thermoelectric generators 64. With several ventilation holes 54 present, the valves 56 of these different ventilation holes 54 can all occupy the same position or occupy different positions from one ventilation hole 54 to the other. Thus, for at least one ventilation hole 54, the valve 56 can be in the closed position while the valves 56 of the other ventilation holes 54 occupy more or less open positions. Furthermore, a same thermoelectric generator 64 can be used to regulate the flow area of several ventilation holes 54.

Whatever the embodiment, the ventilation device is regulated, the flow area of the ventilation hole 54 equipped with the valve 56 not being constant but being able to vary as a function of the cooling requirements. Thus, the bleed air stream from the secondary stream is adjusted as a function of the real or estimated cooling requirements and can be automatically reduced during certain flight phases, like the cruising phase for which the cooling requirements are lower than the maximum cooling requirement. Even though this solution causes the on-board weight of the aircraft to increase, the power gain is clearly greater, which makes it possible to obtain, overall, a reduction of the energy consumption of the aircraft.

Preferably, the ventilation device 52 comprises at least one spring 62 which pushes the valve 56. This solution is prioritized because the ventilation hole 54 is automatically in the totally open position in the event of a malfunction of the electric actuator 60 or of the power supply 76 coming from the aircraft or from the thermoelectric generator 64.

While at least one example embodiment of the invention (s) is disclosed herein, it should be understood that modifications, substitutions, and alternatives may be apparent to one of ordinary skill in the art and can be made without departing from the scope of this disclosure. This disclosure is intended to cover any adaptations or variations of the example embodiment(s). In addition, in this disclosure, the terms "comprise" or "comprising" do not exclude other elements or steps, the terms "a", "an" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. An aircraft propulsion assembly comprising:
  an engine comprising:
    an engine core;
    an outer wall that surrounds and is spaced apart from the engine core; and
    an intermediate zone between a shroud of the engine core and the outer wall;
  a nacelle positioned around the engine;
  an annular duct that is positioned between the outer wall of the engine and the nacelle and is configured to channel a cold air stream;
  a ventilation device that is configured to cool the intermediate zone and comprises:
    a ventilation hole formed in the outer wall of the engine, wherein the ventilation hole allows a flow of air from the annular duct into the intermediate zone;
    a valve formed in and attached to the outer wall of the engine;
    an articulation that is formed in and attached to the outer wall of the engine, wherein the valve is attached to the outer wall of the engine by the articulation, such that the valve is pivotable about the articulation between a closed position, in which the valve shuts the ventilation hole, and an open position, in which the valve at least partially frees the ventilation hole; and
    an electric actuator configured to displace the valve from the open position to the closed position and from the closed position to the open position;
  a thermoelectric generator configured to generate an electric current; and
  a servocontrol configured to control a position of the valve by using the electrical current generated by the thermoelectric generator.

2. The propulsion assembly according to claim 1, wherein the ventilation device comprises a spring configured to push and keep the valve in the open position, the electric actuator being configured to displace the valve from the open position to the closed position against efforts exerted by the spring.

3. The propulsion assembly according to claim 1, wherein the ventilation device comprises an electric cable linking the thermoelectric generator and the electric actuator such that the electrical current generated by the thermoelectric generator powers the electric actuator.

4. The propulsion assembly according to claim 1, wherein the ventilation device comprises a converter comprising a function configured to transform the electric current generated by the thermoelectric generator into a power supply current to power the electric actuator, a given value of the power supply current being a function of a given value of the current generated by the thermoelectric generator and corresponding to a given position of the valve.

5. The propulsion assembly according to claim 1, wherein the ventilation device comprises a relay configured to receive a power current and transmit the power current to the electric actuator as a power supply current as a function of a control current generated by the thermoelectric generator.

6. The propulsion assembly according to claim 5, wherein:
  when the control current has a value lower than a threshold value, the relay is configured to occupy an activated state, in which the relay allows passage of the power current, such that the power supply current has a value equal to that of the power current; and
  when the control current has a value greater than or equal to the threshold value, the relay is configured to occupy a deactivated state, in which the relay blocks the power current, such that the power supply current has a zero value.

7. The propulsion assembly according to claim 5, wherein:
  the ventilation device comprises a switch, positioned between a power supply and the relay; and
  the switch is configured to occupy an on state, in which the switch transmits the power current to the relay, and an off state, in which the switch blocks the power current from being transmitted to the relay.

8. The propulsion assembly according to claim 1, wherein the thermoelectric generator is positioned downstream of the ventilation hole, such that an air stream passing through the ventilation hole impacts the thermoelectric generator.

9. The propulsion assembly according to claim 1, wherein:
  the thermoelectric generator comprises a first face, which is in contact with a cold source or with a cold ambience cooled by a cold source, and a second face, which is in contact with a hot source or a hot ambience heated by a hot source;
  the hot source or the hot ambience exhibits a temperature gradient with the cold source or the cold ambience; and
  the thermoelectric generator is positioned such that the second face of the thermoelectric generator is in contact with a hot source to be cooled or with a hot ambience to be cooled.

10. The propulsion assembly according to claim 1, wherein:
  the outer wall is spaced apart from the shroud and delimits the annular duct; and
  the outer wall has:
    an inner face that is oriented towards the engine core; and
    an outer face that is opposite the inner face; and
  the ventilation hole passes through the outer wall.

11. The propulsion assembly according to claim 10, wherein the thermoelectric generator is positioned at the outer wall and has a first face, which is situated at the outer face of the outer wall and in contact with the cold air stream, and a second face, which is in contact with a hot air present in the intermediate zone.

12. The propulsion assembly according to claim 10, wherein the thermoelectric generator is positioned at the shroud of the engine core and has a first face, which is in contact with air present in the intermediate zone, and a second face, which is pressed against the shroud.

13. An aircraft comprising the propulsion assembly according to claim 1.

14. An aircraft propulsion assembly comprising:
 an engine;
 a nacelle positioned around the engine;
 an annular duct that is positioned between the engine and the nacelle and is configured to channel a cold air stream;
 a ventilation device that is configured to cool a zone to be cooled of the propulsion assembly, wherein:
  the ventilation device comprises at least one ventilation hole which emerges in the zone to be cooled;
  the ventilation device is regulated and comprises at least one valve that is movable between a closed position in which the valve shuts the ventilation hole and an open position in which the valve at least partially frees the ventilation hole; and
  wherein the ventilation device comprises an electric actuator configured to displace the valve from the open position to the closed position and from the closed position to the open position;
 a thermoelectric generator configured to generate an electric current; and
 a servocontrol configured to control a position of the valve by using the electrical current generated by the thermoelectric generator.

15. The propulsion assembly according to claim 14, wherein the ventilation device comprises a spring configured to push and keep the valve in the open position, the electric actuator being configured to displace the valve from the open position to the closed position against efforts exerted by the spring.

16. The propulsion assembly according to claim 14, wherein the ventilation device comprises an electric cable linking the thermoelectric generator and the electric actuator such that the electrical current generated by the thermoelectric generator powers the electric actuator.

17. The propulsion assembly according to claim 14, wherein the ventilation device comprises a converter comprising a function configured to transform the electric current generated by the thermoelectric generator into a power supply current to power the electric actuator, a given value of the power supply current being a function of a given value of the current generated by the thermoelectric generator and corresponding to a given position of the valve.

18. The propulsion assembly according to claim 14, wherein the ventilation device comprises a relay configured to receive a power current and transmit the power current to the electric actuator as power supply current as a function of a control current generated by the thermoelectric generator.

19. The propulsion assembly according to claim 18, wherein:
 when the control current has:
  a value lower than a threshold value, the relay is configured to occupy an activated state, in which the relay allows passage of the power current, such that the power supply current has a value equal to that of the power current; and
  a value greater than or equal to the threshold value, the relay is configured to occupy a deactivated state, in which the relay blocks passage of the power current, such that the power supply current has a zero value; or
 the ventilation device comprises a switch, positioned between a power supply and the relay, configured to occupy an on state, in which the switch transmits the power current to the relay, and an off state, in which the switch blocks the power current from being transmitted to the relay.

* * * * *